(12) United States Patent
Takatani

(10) Patent No.: US 6,894,391 B1
(45) Date of Patent: May 17, 2005

(54) ELECTRODE STRUCTURE ON P-TYPE III GROUP NITRIDE SEMICONDUCTOR LAYER AND FORMATION METHOD THEREOF

(75) Inventor: Kunihiro Takatani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/557,961

(22) Filed: Apr. 25, 2000

(30) Foreign Application Priority Data

Apr. 26, 1999 (JP) ............................................. 11-117775

(51) Int. Cl.[7] .......................... H01L 33/00; H01L 23/48
(52) U.S. Cl. .......................... 257/744; 257/91; 257/94; 257/99; 257/743; 257/745; 257/748; 438/46; 438/47; 438/604; 438/606
(58) Field of Search .......................... 257/94, 99, 743, 257/745, 748, 79, 91, 103, 744, 751, 766, 767; 438/46, 47, 604, 606

(56) References Cited

U.S. PATENT DOCUMENTS

| | | | |
|---|---|---|---|
| 5,990,500 A | * | 11/1999 | Okazaki .................... 257/99 |
| 6,008,539 A | * | 12/1999 | Shibata et al. ............ 257/745 |
| 6,169,297 B1 | * | 1/2001 | Jang et al. ................. 257/99 |
| 6,222,204 B1 | * | 4/2001 | Teraguchi ................. 257/94 |

FOREIGN PATENT DOCUMENTS

| | | |
|---|---|---|
| JP | 60-083325 | 5/1985 |
| JP | 6-314822 | 11/1994 |
| JP | 8-274372 | * 10/1996 |
| JP | 9-232632 | 9/1997 |
| JP | 11-40853 | 2/1999 |
| JP | 11-274562 | 10/1999 |

OTHER PUBLICATIONS

Taek Kim et al., "Cr/Ni/Au ohmic contacts to the moderately doped p– n and n–GaN" Mat. Res. Soc. Symp. Proc. vol. 449, 1997, pp 1061–1065.*

Kim et al., "Cr/Ni/Au ohmic contacts to the moderately doped p– and n–GaN", Mat. Rss. Soc. Symp. Proc. vol. 449, 1997, pp 1061–1065.*

Trexler et al., "Comparison of Ni/Au, Pd/Au, and Cr/Au metallizations for ohmic contacts to p–GaN", Mat. Rss. Soc. Symp. Proc. vol. 449, 1997, pp 1061–1065.*

* cited by examiner

Primary Examiner—Donghee Kang
(74) Attorney, Agent, or Firm—Morrison & Foerster LLP

(57) ABSTRACT

An electrode structure on a p-type III group nitride semiconductor layer includes first, second and third electrode layers successively stacked on the semiconductor layer. The first electrode layer includes at least one selected from a first metal group of Ti, Hf, Zr, V, Nb, Ta, Cr, W and Sc. The second electrode layer includes at least one selected from a second metal group of Ni, Pd and Co. The third electrode layer includes Au.

15 Claims, 9 Drawing Sheets

ELECTRODE STRUCTURE ON P-TYPE III GROUP NITRIDE SEMICONDUCTOR LAYER AND FORMATION METHOD THEREOF

BACKGROUND OF THE INVENTION

1. Field of the Invention

The present invention relates to improvements in an electrode structure in a III group nitride semiconductor device which is represented by a semiconductor laser diode, for example.

2. Description of the Background Art

A GaN type compound semiconductor, which is a III group nitride semiconductor, represented as $In_xGa_yAl_zN$ (for $x+y+z=1$; $0\leq x<1$; $0<y\leq 1$; $0\leq x<1$) has a large energy bandgap and high thermal stability, and its bandgap width can be controlled by adjusting the composition. Therefore, the GaN type semiconductor is expected to be a material which is applicable to various semiconductor devices including a light emitting element and a high temperature device. Especially for light emitting diodes (LEDs) using a GaN type material, devices having a luminous intensity on the order of several candelas in a light wavelength range from blue to green have been already developed and put to practical use. Now, the goals of research and development are shifting to obtaining an LED for long wavelength light to provide a full-color LED display, obtaining a laser diode (LD) for practical use employing a GaN type material, and so on.

FIG. 7 schematically shows in section a structure of a p-type electrode conventionally used in a semiconductor device employing a GaN type material. In the p-type electrode, a metal layer 502 of Ni is deposited on a contact layer 501 of p-type GaN and they are annealed at 500° C. in a nitrogen atmosphere for 10 minutes. Thus, an intermediate layer 504 is formed by diffusion reaction between GaN layer 501 and Ni layer 502. On Ni layer 502, a surface electrode layer 503 for wire bonding or device mounting is also stacked. For example, Au is often used as a material for surface electrode layer 503.

In such an electrode structure, intermediate layer 504 has an effect of mitigating a Schottky barrier which is caused when p-type GaN layer 501 and Ni layer 502 are in direct contact with each other.

However, in the p-type electrode on the p-type GaN contact layer according to the conventional art as illustrated in FIG. 7, the ohmic characteristic is unstable and the specific contact resistance value is relatively high and on the order of $10^{-2}$ $\Omega cm^2$. For example, the specific contact resistance value necessary for a semiconductor laser p-type electrode is about $10^{-3}$ $\Omega cm^2$ or less. This is difficult to be attained through the conventional art.

The inventor conducted a detailed examination of the p-type electrode structure according to the conventional art. As a result, it was found out that the main component of intermediate layer 504 formed in FIG. 7 is a compound of Ga and Ni (Ga—Ni compound: hereinafter, a compound of elements X and Y is denoted as X-Y compound).

It was also known that the characteristic of intermediate layer 504 is easily influenced by the surface state of GaN layer 501, the degree of progress of interface reaction between GaN layer 501 and Ni layer 502, the annealing temperature and so on, and that obtaining a stable constant electrode characteristic is difficult in the p-type electrode including such intermediate layer 504. It was also found out that especially when intermediate layer 504 is insufficiently formed, the adhesion strength between the p-type electrode and p-type GaN contact layer 501 declines substantially, and the electrode is frequently peeled in providing wire bonding for electrically connecting the semiconductor device to a stem and the like.

It also became clear that a compound of Ni—N is also formed besides the compound of Ga—Ni as the main component inside intermediate layer 504. The source of N for the Ni—N compound is p-type GaN layer 501. In other words, it was also found out that N atoms in GaN layers 501 are absorbed into intermediate layer 504, a portion near the surface of p-type GaN layer 501 is changed to a high resistance layer (or an n-type layer) and, as a result, the p-type electrode structure comes to have higher resistance.

SUMMARY OF THE INVENTION

In view of the above described problems with the conventional art found out by the inventor, an object of the present invention is to provide, with a high yield, an electrode structure having stable low resistance and high adhesion strength on a p-type III group nitride semiconductor layer.

According to the present invention, an electrode structure on a p-type III group compound semiconductor layer includes first, second and third electrode layers successively stacked on the semiconductor layer. The first electrode layer includes at least one selected from a first metal group of Ti, Hf, Zr, V, Nb, Ta, Cr, W and Sc. The second electrode layer includes at least one selected from a second metal group of Ni, Pd and Co. The third electrode layer includes Au.

In such an electrode structure, Ti, for example, included in the first electrode layer is a metal which has been used in an n-type electrode structure on an n-type GaN layer, for example. If a single Ti layer is formed on a p-type GaN layer, it functions as a Schottky electrode. However, it was found out that by uniformly using a small amount of Ti as the first electrode layer at an interface between the second layer including Ni, for example, and the p-type GaN layer, the small amount of Ti hardly causes the Schottky effect and it serves as an interface reaction promoter.

It was known as a result that the annealing temperature for attaining a good ohmic contact can be lowered by about 100 to 200° C. as compared with the conventional structure and a small specific contact resistance value and a high adhesion strength can be obtained in the p-type electrode structure.

It is preferred that the first electrode layer has a thickness in a range from 1 to 500 nm, the second electrode layer has a thickness of 5 nm or more, and the third electrode layer has a thickness of 50 nm or more.

After the heat treatment for attaining the ohmic characteristic, the first electrode layer includes a nitride of a metal included in the first metal group and also includes a compound of Ga and a metal included in the second metal group.

According to the present invention, a method of forming an electrode structure on a p-type III group nitride semiconductor layer includes the steps of depositing on a semiconductor layer a first electrode layer including at least one selected from a first metal group of Ti, Hf, Zr, V, Nb, Ta, Cr, W and Sc, depositing on the first electrode layer a second electrode layer including at least one selected from a second metal group of Ni, Pd and Co, and depositing on the second electrode layer a third electrode layer including Au.

After the first to third electrode layers are thus deposited, the electrode structure is heated at a temperature in a range from 300 to 700° C. in an N$_2$ atmosphere, in an Ar atmosphere or in a vacuum to attain the ohmic characteristic.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following first and second embodiments were provided as specific examples of the present invention, and some matters related to them were examined. The first embodiment relates to an Au/Ni/Ti electrode structure which includes Ti, Ni and Au layers successively stacked on a p-type GaN contact layer. The second embodiment relates to an Au/Pd/Ti electrode structure which employs a Pd layer instead of the Ni layer.

First Embodiment

Figure 1:
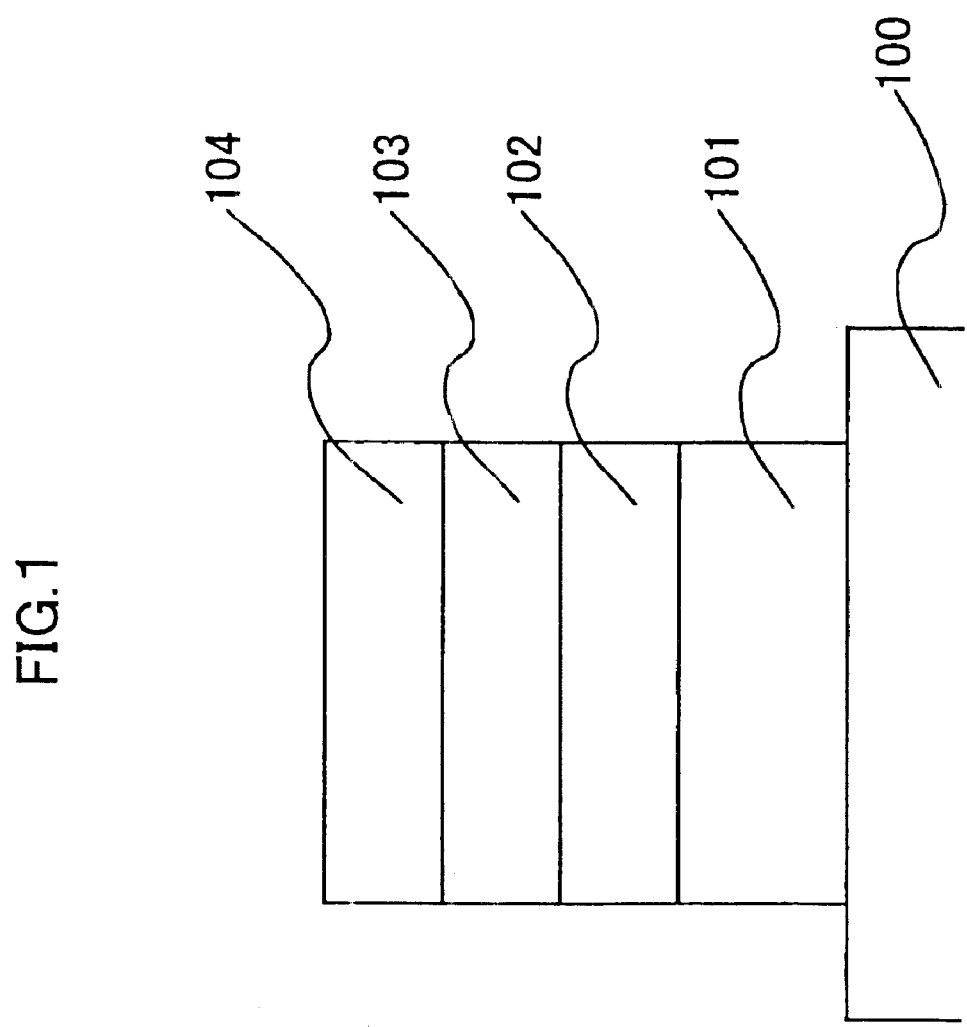
FIG. 1 is a schematic sectional view showing a state immediately after a plurality of metal layers are deposited on a III group nitride semiconductor contact layer in an electrode structure of the present invention.

Referring to the schematic sectional view in FIG. 1, a p-type GaN layer was first formed, on a sapphire substrate 100, as a contact layer 101 of a p-type III group nitride semiconductor included in an arbitrary semiconductor device. To form p-type GaN layer 101, a GaN layer doped with Mg was epitaxially grown by the metal organic chemical vapor deposition (MOCVD) method. Mg of $10^{19}/cm^3$ was added to GaN layer 101. After the GaN layer was annealed in an N$_2$ atmosphere to make it a p-type layer, p-type GaN layer 101 exhibited a carrier density of 1.5× $10^{17}/cm^3$.

Thereafter, sapphire substrate 100 was placed in an electron beam (EB) vacuum evaporation system, where a Ti layer having a thickness of 5 nm, an Ni layer having a thickness of 15 nm and an Au layer having a thickness of 200 nm were deposited as first, second and third electrode layers 102, 103 and 104 on p-type GaN contact layer 101.

Finally, the entire electrode structure on sapphire substrate 100 was annealed at about 400° C. in an N$_2$ atmosphere to complete the electrode structure of the first embodiment.

Figure 2:
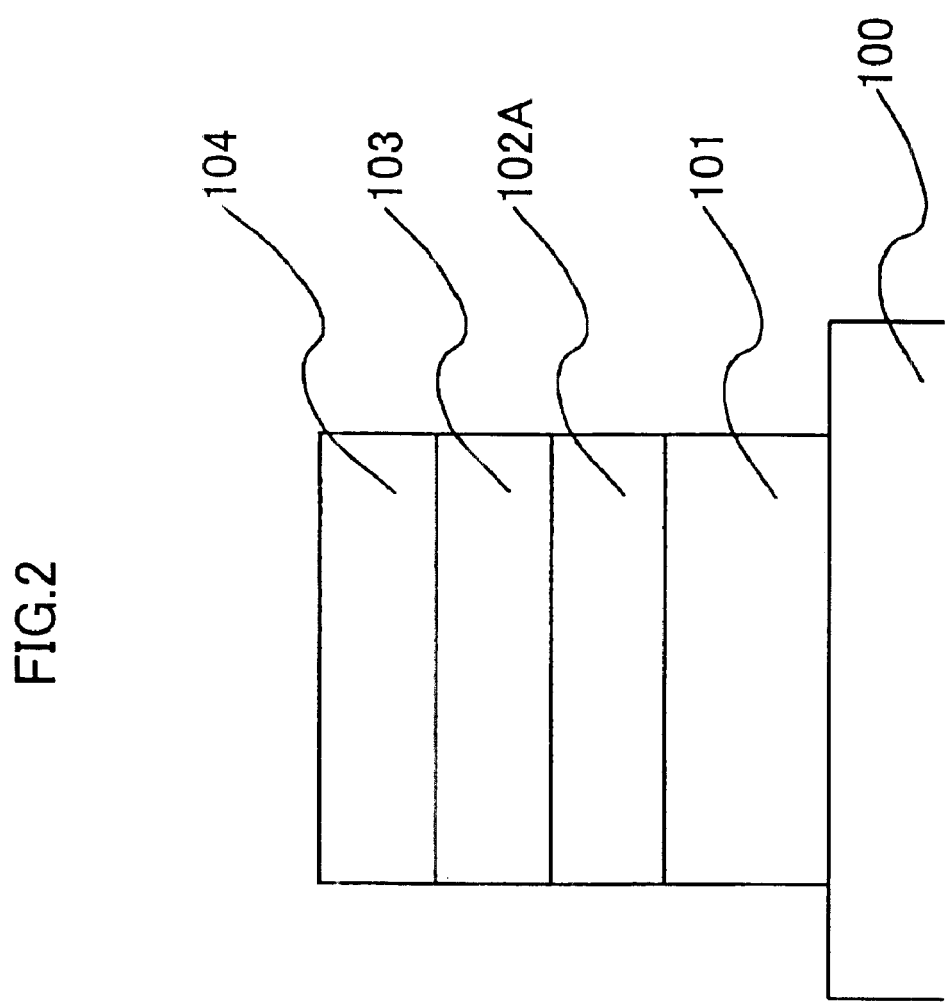
FIG. 2 is a schematic sectional view showing a state after an annealing process for attaining the ohmic characteristic in the electrode structure of the present invention.

FIG. 2 schematically shows in section the electrode structure completed by utilizing the present invention. When the electrode structure after annealed at 400° C. in the first embodiment was examined in detail, it was found out that p-type GaN layer 101, a mixture layer 102A of a Ti—N compound and an Ni—Ga compound, Ni layer 103 and Au layer 104 are formed in this order on sapphire substrate 100. Meanwhile, the Ti—N compound and the Ni—Ga compound were hardly detected in the electrode structure before the annealing at 400° C. Consequently, it can be recognized that the two types of Ti—N and Ni—Ga compounds are formed by a reaction during the annealing process at 400° C. for attaining the ohmic characteristic.

As described before, the Ni—N compound which is formed between p-type GaN layer 501 and Ni layer 502 in the conventional electrode structure causes the higher resistance and the instability of the electrode structure. In the first embodiment, however, Ti layer 102 exists before final annealing for attaining the ohmic characteristic, and thus the Ti—N compound is first formed between p-type GaN layer 101 and Ti layer 102 at the initial stage of the final annealing. Since N for the Ti—N compound is mainly supplied from p-type GaN layer 101, the surface of GaN layer 101 comes to contain excessive Ga. The excessive, free Ga and Ni from Ni layer 103 directly react together and form the Ni—Ga compound in mixture layer 102A. It can be considered that through the reaction process, the reaction for attaining the ohmic characteristic between p-type GaN contact layer 101 and the metal electrode can be promoted without damaging the stoichiometric composition ratio at the surface of p-type GaN layer 101 and without forming a high resistance layer (or an n-type layer) due to formation of the Ni—N compound in the first embodiment.

Figure 3:
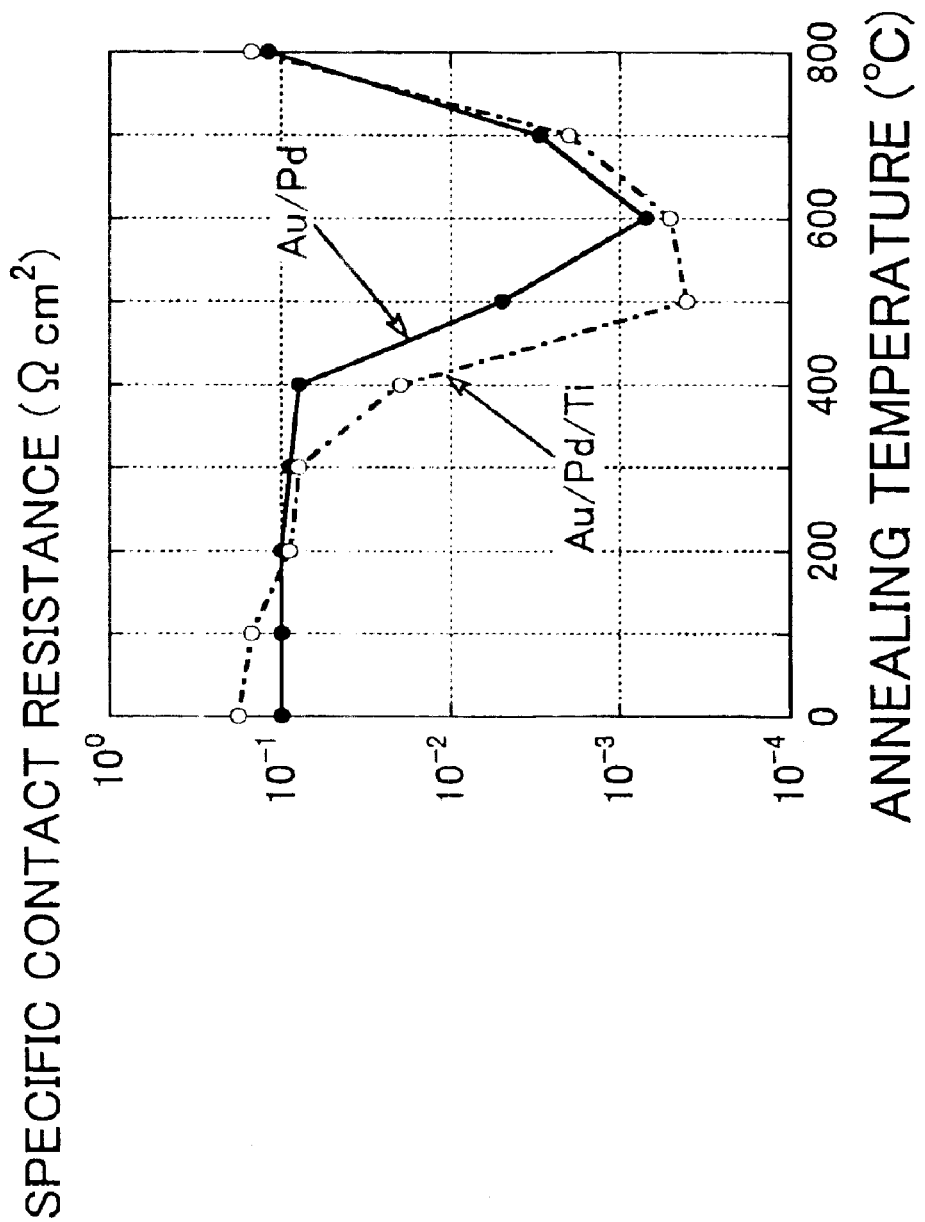
FIG. 3 is a graph illustrating relations between the annealing temperature for attaining the ohmic characteristic and the contact resistance in an electrode structure of a first embodiment.

FIG. 3 is a graph which proves such facts. In the graph, the horizontal axis represents the annealing temperature (° C.) for attaining the ohmic characteristic of the electrode structure, and the vertical axis represents the contact resistance ($\Omega cm^2$) after the process for attaining the ohmic characteristic.

As can be seen from FIG. 3, for the conventional Au/Ni electrode structure, the contact resistance starts to fall remarkably due to an interface reaction between GaN layer 501 and Ni layer 502 from the annealing temperature of 400° C. as indicated by the black circles while, for the Au/Ni/Ti electrode structure of the first embodiment, the contact resistance starts to fall remarkably from the annealing temperature of 300° C. as indicated by the white circles and thus the reaction between GaN layer 101 and Ni layer 103 starts at a temperature lower than the conventional case. Since the ohmic characteristic can be attained by such relatively low temperature annealing, it is made possible to improve the accuracy of temperature control during the electrode manufacturing process and to simplify the process, which are very effective advantages for the manufacturing process.

As can also be seen from FIG. 3, the Au/Ni/Ti electrode structure of the first embodiment has smaller contact resistance than the conventional Au/Ni electrode structure in an annealing temperature range from 300 to 600° C. Furthermore, the annealing temperature which can attain the lower limit contact resistance is 500° C. for the conventional Au/Ni electrode structure while it is lower 400° C. for the Au/Ni/Ti electrode structure of the first embodiment. This is because Ti layer 102 is inserted in the first embodiment, which suppresses deviation in the stoichiometric composition ratio at the surface of GaN layer 501 observed in the conventional electrode structure and formation of a high resistance layer (or an n-type layer) caused by production of the Ni—N compound.

Figure 4:
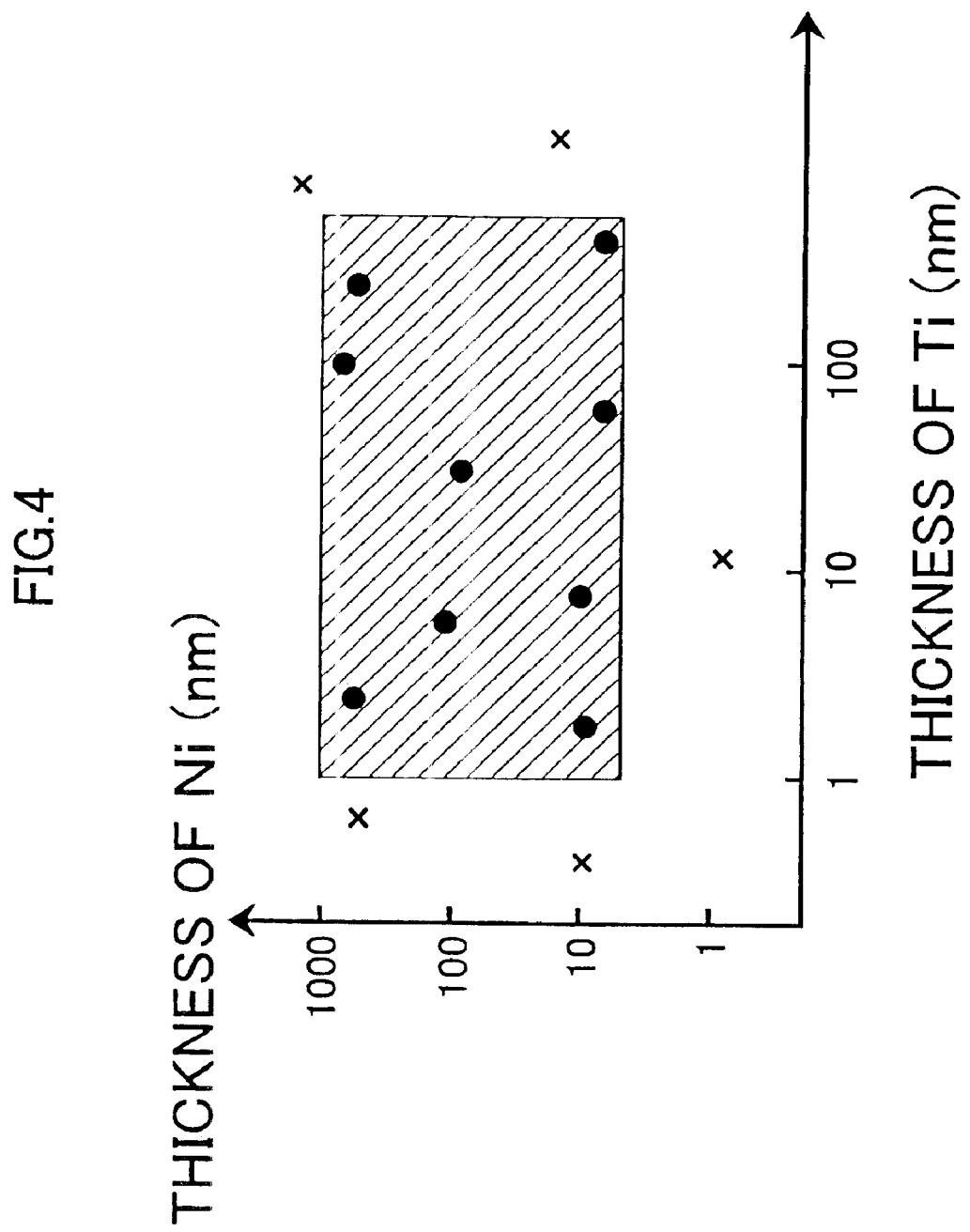
FIG. 4 is a graph illustrating preferable thickness ranges of Ti and Ni layers in the electrode structure of the first embodiment.

FIG. 4 shows the results of determining the ohmic characteristic, after the thickness of each of Ti layer 102 and Ni layer 103 was variously changed and then they were annealed in the Au/Ni/Ti electrode structure of the first embodiment. In FIG. 4, the horizontal axis represents the thickness (nm) of Ti layer 102, and the vertical axis represents the thickness (nm) of Ni layer 103. Each of black circles denotes the case where smaller contact resistance was stably obtained in the Au/Ni/fi electrode as compared with the conventional Au/Ni electrode. Each of symbols x denotes the case where remarkable improvement was not attained as compared with the conventional example.

As shown in FIG. 4, when the thickness of Ti layer 102 was within the range of about 1 to 500 nm, the Au/Ni/Ti electrode structure attained smaller contact resistance than the conventional Au/Ni electrode structure. However, when Ti layer 102 was thinner than 1 nm and was 0.5 nm, for example, the contact resistance of the Au/Ni/Ti electrode structure after annealing exhibited hardly any improvement over the conventional Au/Ni electrode structure. The reason is considered that because Ti layer 102 is too thin, the absolute amount for forming the Ti—N compound by the interface reaction with GaN layer 101 becomes scarce, and as a result the reaction of Ni from Ni layer 103 with GaN layer 101 becomes predominant. Meanwhile, when Ti layer 102 is thicker than 500 nm, the Au/Ni/Ti electrode structure did not exhibit the ohmic characteristic but it indicated only the Schottky characteristic even if the annealing temperature or time was increased. The reason is considered that because Ti layer 102 is too thick, Ni layer 103 and GaN layer 101 are completely separated, and as a result Ni cannot contribute to the reaction.

When the thickness of Ni layer 103 was about 5 nm or more, the Au/Ni/Ti electrode structure attained smaller contact resistance than the conventional Au/Ni electrode structure. However, when Ni layer 103 was thinner than 5 nm and was 1 nm, for example, the Au/Ni/Ti electrode structure exhibited an insufficient ohmic characteristic even after annealing. The reason is considered that because the thickness of Ni layer 103 is insufficient, Au passes from Au layer 104 through Ni layer 103 to Ti layer 102 by thermal diffusion. Meanwhile, even when the upper limit thickness of Ni layer 103 was raised to about 1 μm, the electrical characteristic of the Au/Ni/Ti electrode structure was not affected. However, when the thickness of Ni layer 103 exceeds 1 μm, the electrode structure slightly tended to be easily peeled. Considering the adhesion strength which is important in applying the electrode structure to an actual semiconductor device, the preferable upper limit thickness of Ni layer 103 would be about 1 μm.

To examine in more detail the characteristic of the Au/Ni/Ti electrode structure of the first embodiment, an Ni/Ti electrode structure as a comparative example not including an Au layer was also produced by way of example. However, the Ni/Ti electrode structure caused Ni to form a compound with N in an N₂ atmosphere during annealing, and thus could not attain good ohmic characteristic. After examining the phenomenon, it was found out that the change due to nitridation of the Ni layer can be prevented only by stacking Au layer 104 as in the first embodiment, and that the thickness of the Au layer is sufficient if it is about 50 nm or more.

Meanwhile, the upper limit thickness of Au layer 104 is not limited at all from the viewpoint of the electrical characteristic of the electrode. However, if Au layer 104 is thicker than about 5 μm, the lift-off process, if used, becomes less easy. Furthermore, from the perspective of adhesion in the wire bonding process, 5 μm is sufficient for the thickness of Au layer 104. When the thickness is made larger than 5 μm, the amount of expensive Au used increases and it is not preferred. Therefore, the preferable upper limit thickness of Au layer 104 would be about 5 μm.

An Au/Ti/Ni electrode structure and an Au/(TiNi alloy) electrode structure were also produced by way of comparative examples against the Au/Ni/Ti electrode structure of the first embodiment. However, any of the comparative examples could not attain the good electrical characteristic as in the first embodiment. The facts are illustrated in the graphs of FIGS. 8 and 9 similar to FIG. 3.

Figure 8:
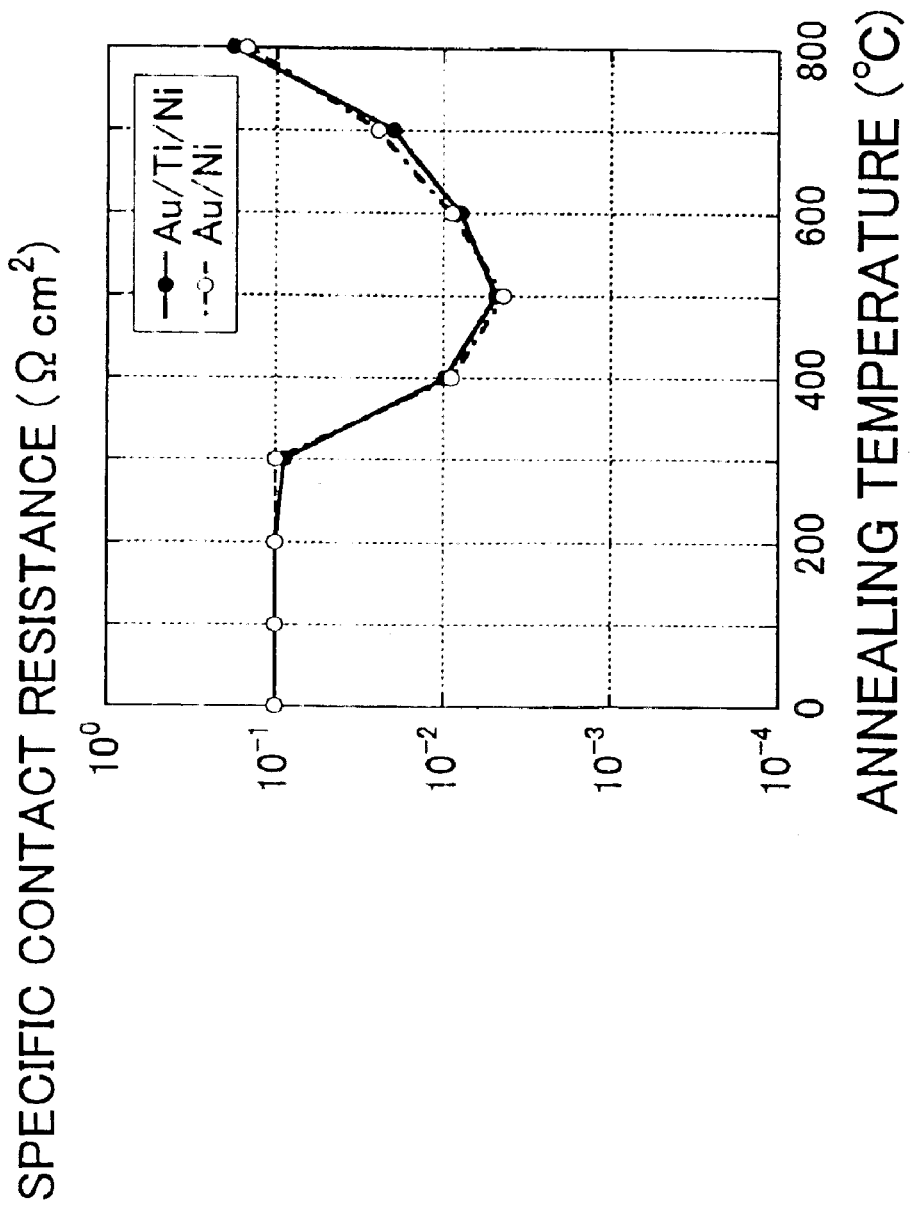
FIG. 8 is a graph illustrating relations between the annealing temperature for attaining the ohmic characteristic and the contact resistance in an Au/Ti/Ni electrode structure of a comparative example and in the conventional Au/Ni electrode structure.

In the graph of FIG. 8, the black and white circles denote the dependence of the contact resistance on the annealing temperature in the Au/Ti/Ni electrode structure as the comparative example and in the conventional Au/Ni electrode structure, respectively. As illustrated in the graph, the comparative Au/Ti/Ni electrode structure hardly brings about improvement in the contact resistance as compared with the conventional Au/Ni electrode structure. This would be because the Ni layer even in the Au/Ti/Ni electrode structure is in direct contact with the p-type GaN layer similarly to the conventional case, and a Ni—N compound is formed at the interface and a high resistance interface layer is caused.

Figure 9:
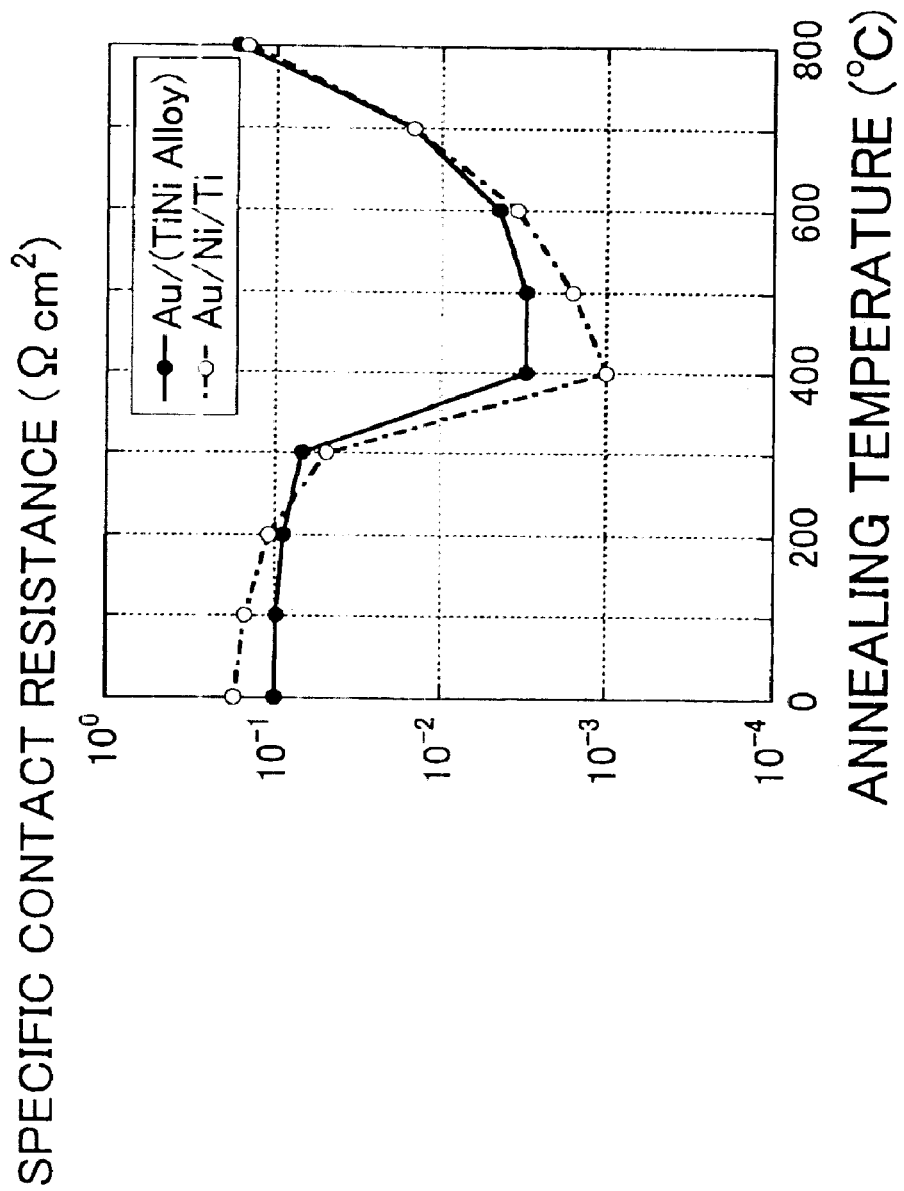
FIG. 9 is a graph illustrating relations between the annealing temperature for attaining the ohmic characteristic and the contact resistance in an Au/(Ti/Ni alloy) electrode structure of a comparative example, in contrast with the first embodiment.

In the graph of FIG. 9, the black and white circles denote the dependence of the contact resistance on the annealing temperature in the Au/(TiNi alloy) electrode structure as the comparative example and in the Au/Ni/Ti electrode structure of the first embodiment. In the comparative Au/(TiNi alloy) electrode structure, there still is a tendency that Ni or a portion with a high Ni concentration in the TiNi alloy layer partially comes into direct contact with and reacts with the p-type GaN contact layer to produce the Ni—N compound. Therefore, in the comparative Au/(TiNi alloy) electrode structure, a high resistance region would be partially formed after annealing and, as a result, the contact resistance on average in the entire electrode would increase.

Meanwhile, in the Au/Ni/Ti electrode structure of the first embodiment, Ti layer 102 covers the surface of GaN layer 101 before annealing, and therefore the Ni—N compound as a cause of the higher resistance is not produced and the smaller resistance values can be stably obtained as compared with the comparative Au/(TiNi alloy) as illustrated in FIG. 9. That is, it can been understood that Ti layer 102 formed between Ni layer 103 and p-type GaN contact layer 101 plays an important role for improving the electrical characteristic of the electrode structure of the first embodiment.

In the first embodiment, the density of Mg contained in the p-type GaN contact layer was varied in a range from $1.0 \times 10^{18}$ to $1.0 \times 10^{20}/cm^3$. For the p-type GaN contact layer having any Mg density, the Au/Ni/Ti electrode structure could attain a good ohmic characteristic.

Although the annealing process of the electrode structure for attaining the ohmic characteristic was performed in the N$_2$ atmosphere in the first embodiment, it may also be conducted in an Ar atmosphere or in a vacuum. In this case, the optimum annealing temperature slightly changes as compared with the case where the N$_2$ atmosphere is used, but it still becomes lower than the optimum annealing temperature of the conventional Au/Ni electrode structure in a similar manner.

Since the interface reaction during annealing is reliably provided at a lower temperature with little influence from conditions of temperature etc. as compared with the conventional example, the problem of peeling which was often observed due to insufficient adhesion strength in the conventional electrode is not caused.

Second Embodiment

Referring to FIG. 1, a p-type GaN contact layer 101 doped with Mg was also formed on a sapphire substrate 100 in a second embodiment similarly to the first embodiment. On GaN contact layer 101, a Ti layer 102 having a thickness of 5 nm, a Pd layer 103 having a thickness of 30 nm and an Au layer 104 having a thickness of 200 nm were deposited by the EB evaporation method. The entire electrode structure on sapphire substrate 100 was annealed at about 500° C. in an N$_2$ atmosphere to complete the electrode structure of the second embodiment.

Referring to FIG. 2, it was known in the completed electrode structure of the second embodiment that p-type GaN layer 101, a mixture layer 102A of a Ti—N compound and a Pd—Ga compound, Pd layer 103 and Au layer 104 are formed in this order on sapphire substrate 100. In the sectional electrode structure before annealing at 500° C., the Ti—N and Pd—Ga compounds were hardly detected. It can be recognized from this fact that the two types of the Ti—N compound and the Pd—Ga compound were formed by a reaction during the annealing process at 500° C. for attaining the ohmic characteristic.

In a case of an Au/Pd electrode structure as a comparative example not including a Ti layer, a Pd—N compound is formed between the Pd layer and the GaN contact layer after annealing. The Pd—N compound causes to the higher resistance and the instability of the electrode structure similarly to the Ni—N compound in the conventional Au/Ni electrode structure. In the second embodiment, however, Ti layer 102 plays the same role as in the first embodiment before annealing for the ohmic characteristic. It can be considered therefore that the reaction for attaining the ohmic characteristic between p-type GaN contact layer 101 and the metal electrode can be promoted without damaging the stoichiometric composition ratio at the surface of p-type GaN layer 101 and without forming a high resistance layer (or an n-type layer) due to formation of the Pd—N compound.

Figure 5:
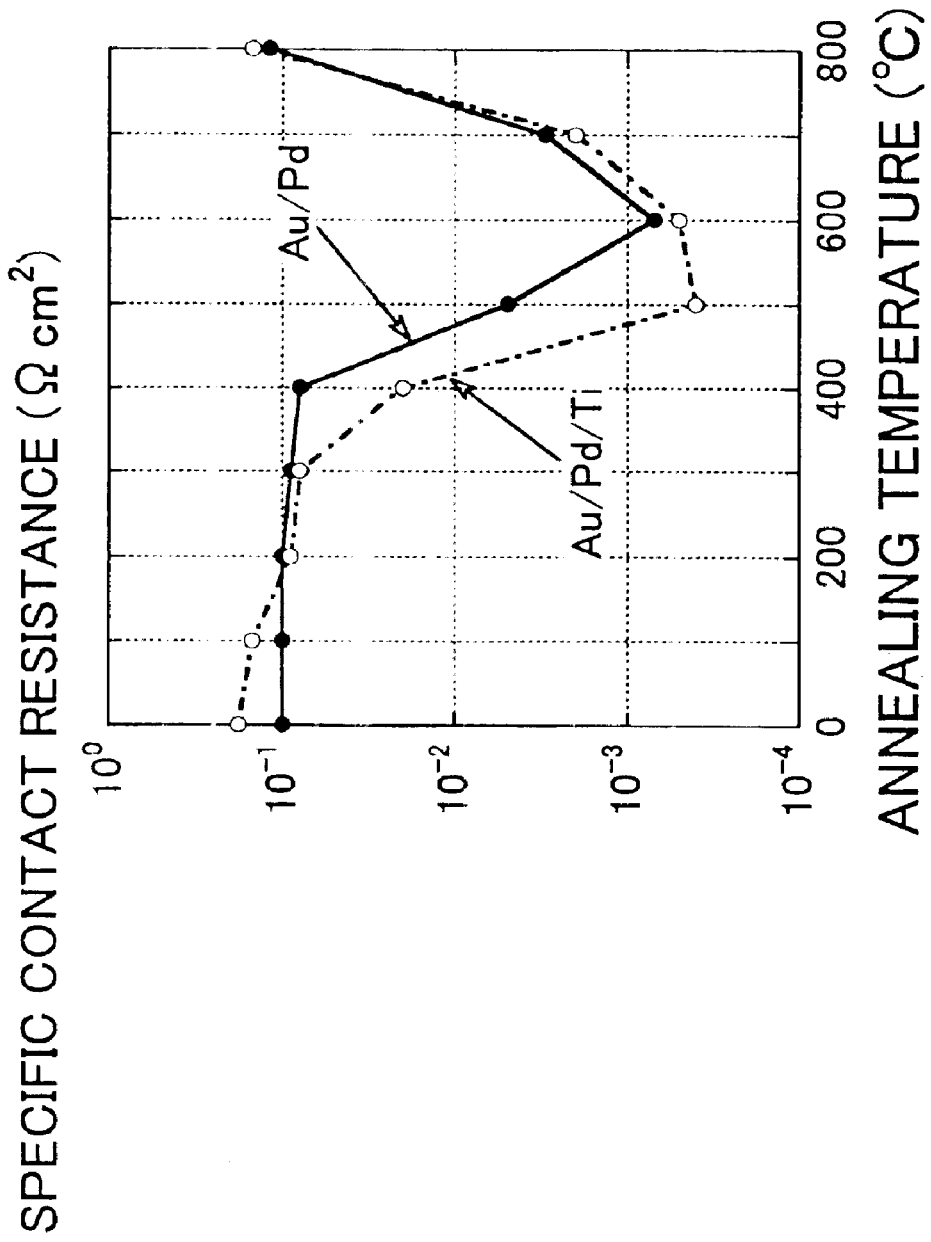
FIG. 5 is a graph illustrating relations between the annealing temperature for attaining the ohmic characteristic and the contact resistance in an electrode structure of a second embodiment.

In the graph of FIG. 5 similar to FIG. 3, the white and black circles denote the dependence of the contact resistance on the annealing temperature in the Au/Pd/Ti electrode structure of the second embodiment and in the Au/Pd electrode structure as the comparative example, respectively. As illustrated in the graph, the Au/Pd/Ti electrode structure of the second embodiment has smaller contact resistance than the comparative Au/Pd electrode structure in a temperature range from 400 to 600° C. In addition, the annealing temperature at which the contact resistance starts to fall remarkably due to the interface reaction is 500° C. for the comparative Au/Pd electrode structure and 400° C. for the Au/Pd/Ti electrode structure of the second embodiment, resulting in decrease of about 100° C. Attaining the ohmic characteristic by annealing at a lower temperature can be a very effective advantage in the electrode manufacturing process as described with respect to the first embodiment.

Figure 6:
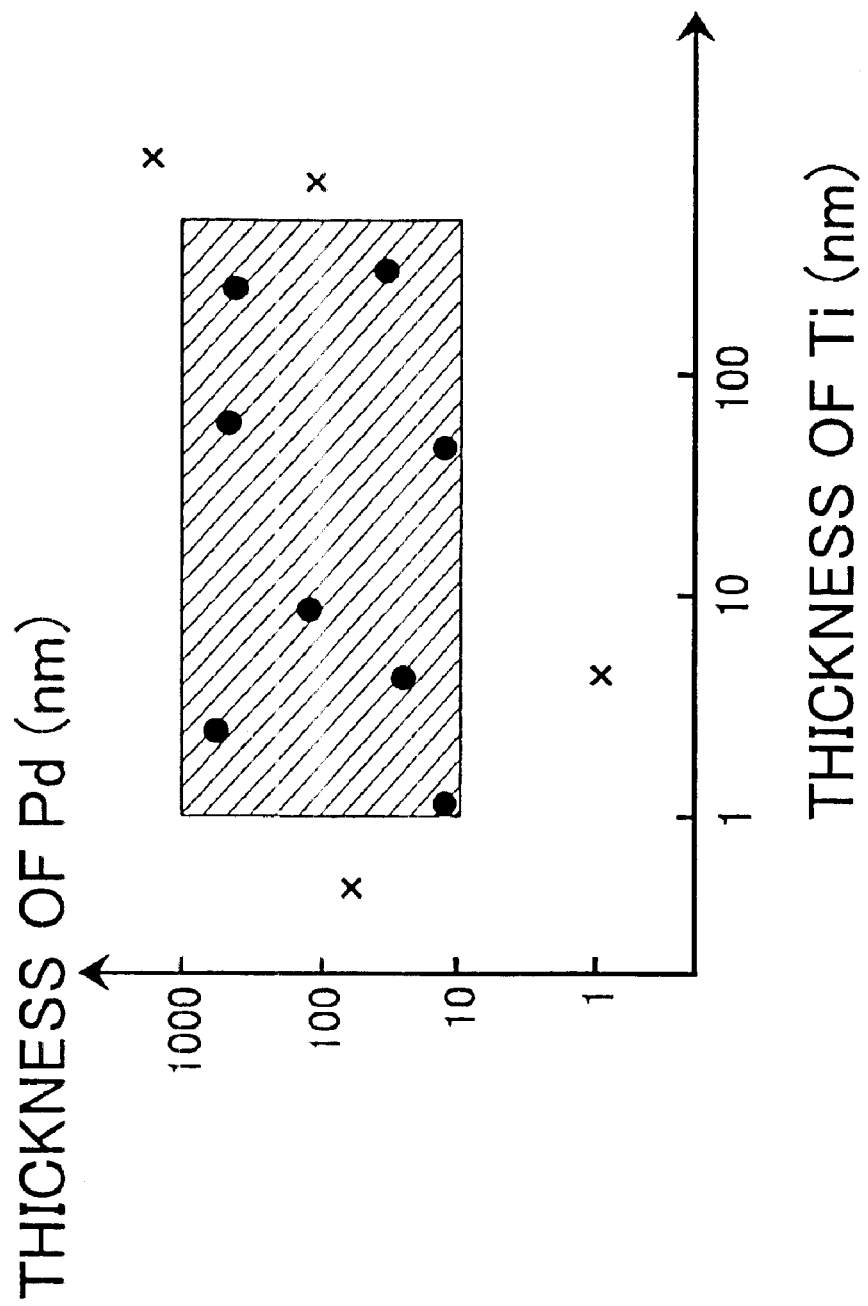
FIG. 6 is a graph illustrating preferable thickness ranges of Ti and Pd layers in the electrode structure of the second embodiment.
Figure 7:
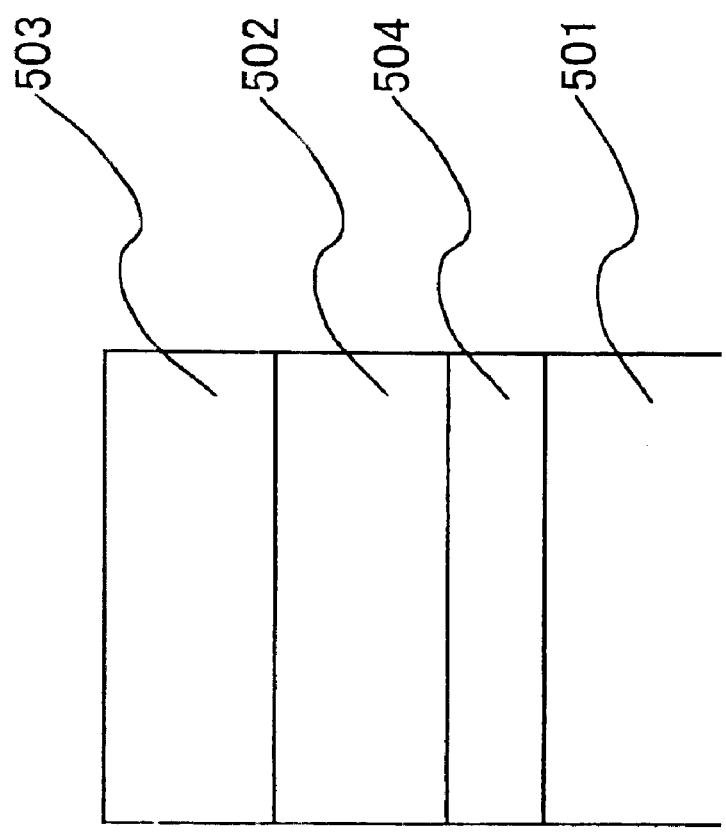
FIG. 7 is a schematic sectional view showing a state after a heat treatment for attaining the ohmic characteristic in a conventional electrode structure.

The graph of FIG. 6 similar to FIG. 4 illustrates the results of determining the ohmic characteristic after the thickness of each of Ti layer 102 and Pd layer 103 was variously changed and then they were annealed in the Au/Pd/Ti electrode structure of the second embodiment. In the second embodiment, low contact resistance was also stably obtained when the thickness of Ti layer 102 was in a range from about 1 to 500 nm similarly to the first embodiment. When the thickness of Pd layer 103 was about 10 nm or more, lower contact resistance was stably obtained as compared with the conventional example. Concerning the upper limit of the thickness of Pd layer 103, it was observed that the thickness of about 1 μm or less does not affluence the electrical characteristic of the Au/Pd/Ti electrode structure whereas the thickness exceeding 1 μm tends to cause peeling of the electrode structure similarly as in the first embodiment. Therefore, the upper limit of the preferable thickness of Pd layer 103 would also be about 1 μm in the second embodiment similarly to the first embodiment.

A Pd/Ti electrode structure as a comparative example not including an Au layer was also produced by way of example. However, in the comparative Pd/Ti electrode structure, Pd formed a compound with N in an N$_2$ atmosphere during annealing and the good ohmic characteristic could not be obtained. After examining the phenomenon, it was found out the quality change due to nitridation of the Pd layer can be prevented only by stacking the Au layer as described with respect to the first embodiment, and that the thickness of the Au layer is sufficient if it is about 50 nm. In addition, the upper limit thickness of the Au layer would be preferably about 5 μm or less for the same reason described with reference to the first embodiment.

In the second embodiment, the density of Mg contained in the p-type GaN contact layer was varied in a range from $1.0 \times 10^{18}$ to $1.0 \times 10^{20}/cm^3$ similarly to the first embodiment, and then the good ohmic characteristic could be obtained for the p-type GaN contact layer having any Mg density by the Au/Pd/Ti electrode structure.

Although the annealing process of the electrode structure of the second embodiment for attaining the ohmic characteristic was performed in the N$_2$ atmosphere similarly to the first embodiment, annealing may also be conducted in an Ar atmosphere or in a vacuum. In this case as well, the optimum annealing temperature slightly changes as compared with the case where the N$_2$ atmosphere is used, but it is still lower than the optimum annealing temperature of the comparative Au/Pd electrode structure.

Since the interface reaction during annealing is reliably provided at a lower temperature with little influence from conditions of temperature etc. as compared with the conventional example even in the second embodiment similarly to the first embodiment, the problem of peeling which was often observed due to insufficient adhesion strength in the conventional electrode is not caused.

Consideration of Related Matters

When each of the above described electrode structures of the first and second embodiments was applied to an AlGaInN type semiconductor laser element, it was observed that the voltage drop in the electrode portion can be suppressed as compared with the conventional electrode structure, and that power consumption of the entire semiconductor laser element can be reduced. When the Au/Ni/Ti electrode of the first embodiment and the conventional Au/Ni electrode were applied to the same type of semiconductor lasers each having a stripe width of 5 µm and a resonator length of 500 µm, it was observed that the voltage drops in the respective electrode portions when electricity of 20 mA was supplied were about 0.8 V and about 4 V, indicating the superior effect of the present invention. It was also confirmed that, by using the Pd layer instead of the Ni layer as in the second embodiment, the contact resistance can be reduced further and, as a result, the voltage drop in the electrode portion of the semiconductor laser element can be reduced further.

In the second embodiment, second metal layer 103 of Pd was stacked on first metal layer 102 of Ti. This is a structure necessary for efficiently forming such mixture layer 102A of the Pd—Ga compound and the Ti—N compound that is a characteristic feature of the present invention as described with reference to the first embodiment. In other words, if the stacked structure is Au/Ti/Pd or Au/(TiPd alloy), the low contact resistance as a feature of the present invention cannot be obtained.

In the first and second embodiments, Ti was used as first metal layer 102 which was in direct contact with the p-type GaN contact layer. After further examination, it was found out that not only Ti but also a single metal or an alloy of Hf, Zr, V, Nb, Ta, Cr, W, Sr and the like can be used to obtain similar effects.

The Au/Co/Ti electrode structure in which Co was selected for the second metal layer stacked on first metal layer 102 was examined. It was also confirmed that the electrode structure can obtain superior electrical characteristic and adhesion strength as compared with the Au/Co electrode structure not including a Ti layer, similarly to the cases of the first and second embodiments.

Although the EB evaporation method was employed for depositing each metal layer in the first and second embodiments, other methods such as a sputtering method or a CVD method may be naturally used.

As described above, according to the electrode structures of the present invention, an electrode structure having low resistance and a good ohmic characteristic can be implemented by suppressing the cause of the higher resistance of the electrode structure for the p-type GaN contact layer, the adhesion strength between the contact layer and the electrode structure can be improved, and the production yield of semiconductor devices can be substantially increased. Since the annealing temperature necessary for attaining the ohmic characteristic of the electrode structure can be lowered as a secondary effect of the present invention, the present invention can greatly contribute to simplification and easier control in the manufacturing process of semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode structure on a p-type III group nitride semiconductor layer, comprising first, second and third electrode layers successively stacked on said semiconductor layer,
    said first electrode layer comprising at least one selected from a first metal group consisting of Hf, Zr, Nb, Ta and Sc,
    said second electrode layer comprising Co, and
    said third electrode layer comprising Au.

2. The electrode structure according to claim 1, wherein said first electrode layer has a thickness in a range from 1 to 500 nm.

3. The electrode structure according to claim 1, wherein said second electrode layer has a thickness of 5 nm or more.

4. The electrode structure according to claim 1, wherein said first electrode layer comprises a nitride of a metal included in said first metal group, and also comprises a compound of Ga and Co.

5. An electrode structure on a p-type III group nitride semiconductor layer, comprising first, second and third electrode layers successively stacked on said semiconductor layer,
    said first electrode layer comprising at least one selected from a first metal group consisting of Hf, Zr, Nb, Ta and Sc,
    said second electrode layer comprising Ni, and
    said third electrode layer comprising Au.

6. The electrode structure according to claim 5, wherein said first electrode layer has a thickness in a range from 1 to 500 nm.

7. The electrode structure according to claim 5, wherein said second electrode layer has a thickness of 5 nm or more.

8. The electrode structure according to claim 5, wherein said first electrode layer comprises a nitride of a metal included in said first metal group, and also comprises a compound of Ga and Ni.

9. An electrode structure on a p-type III group nitride semiconductor layer, comprising first, second and third electrode layers successively stacked on said semiconductor layer,
    said first electrode layer comprising Hf, and said second electrode layer comprising at least one selected from a metal group consisting of Ni, Pd and Co, and
    said third electrode layer comprising Au.

10. The electrode structure according to claim 9, wherein said first electrode layer has a thickness in a range from 1 to 500 nm.

11. The electrode structure according to claim 9, wherein said second electrode layer has a thickness of 5 nm or more.

12. The electrode structure according to claim 9, wherein said first electrode layer comprises a nitride of a metal included in said first metal group, and also comprises a compound of Ga and a metal included in said metal group.

13. An electrode structure on a p-type III group nitride semiconductor layer, comprising first, second and third electrode layers successively staked on said semiconductor layer,
    said first electrode layer comprising a mixture containing a nitride of at least one selected from a first metal group consisting of Hf, Zr, Nb, Ta and Sc, and a Ga compound comprising Ni or Co,
    said second electrode layer comprising Ni or Co selected so as to form said Ga compound contained in said first electrode layer, and
    said third electrode layer comprising Au.

14. The electrode structure according to claim 13, wherein said second electrode layer has a thickness of 5 nm or more.

15. The electrode structure according to claim 13, wherein said third electrode layer has a thickness of 5 nm or more.

* * * * *